United States Patent
Hsu et al.

(10) Patent No.: US 10,354,974 B2
(45) Date of Patent: Jul. 16, 2019

(54) STRUCTURE AND FORMATION METHOD OF CHIP PACKAGE STRUCTURE

(71) Applicant: MediaTek Inc., Hsin-Chu (TW)

(72) Inventors: Wen-Sung Hsu, Zhubei (TW); Shih-Chin Lin, Taoyuan (TW); Andrew C. Chang, Hsinchu (TW); Tao Cheng, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 364 days.

(21) Appl. No.: 14/736,684

(22) Filed: Jun. 11, 2015

(65) Prior Publication Data

US 2016/0172334 A1    Jun. 16, 2016

Related U.S. Application Data

(60) Provisional application No. 62/090,608, filed on Dec. 11, 2014.

(51) Int. Cl.
*H01L 25/065*    (2006.01)
*H01L 23/498*    (2006.01)
(Continued)

(52) U.S. Cl.
CPC ...... *H01L 25/0657* (2013.01); *H01L 23/3114* (2013.01); *H01L 23/3135* (2013.01);
(Continued)

(58) Field of Classification Search
CPC ....... H01L 2224/97; H01L 2224/32145; H01L 25/0657; H01L 2224/16145;
(Continued)

(56) References Cited

U.S. PATENT DOCUMENTS 7,060,535 B1 *    6/2006    Sirinorakul .......... H01L 21/4832
                                              257/702
2009/0008765 A1 *    1/2009    Yamano .................. H01L 24/83
                                              257/690
(Continued)

FOREIGN PATENT DOCUMENTS

CN    102386113 A    3/2012
CN    102403275    4/2012
(Continued)

*Primary Examiner* — Tom Thomas
*Assistant Examiner* — John Bodnar
(74) *Attorney, Agent, or Firm* — Wolf, Greenfield & Sacks, P.C.

(57) ABSTRACT

A chip package structure and a method for forming a chip package are provided. The chip package structure includes a first package which includes at least a semiconductor die, a dielectric structure surrounding the semiconductor die, and a plurality of conductive structures penetrating through the dielectric structure and surrounding the semiconductor die. The package structure also includes an interposer substrate over the first package and a plurality of conductive features in or over the interposer substrate. The package structure further includes a second package over the interposer substrate, and the first package electrically couples the second package through the conductive structures and the conductive features.

17 Claims, 6 Drawing Sheets

(51) Int. Cl.
*H01L 23/528* (2006.01)
*H01L 23/31* (2006.01)
*H01L 23/538* (2006.01)
*H01L 23/00* (2006.01)
*H01L 25/10* (2006.01)
*H01L 25/00* (2006.01)

(52) U.S. Cl.
CPC ...... *H01L 23/49827* (2013.01); *H01L 23/528* (2013.01); *H01L 23/5389* (2013.01); *H01L 24/19* (2013.01); *H01L 24/96* (2013.01); *H01L 24/97* (2013.01); *H01L 25/105* (2013.01); *H01L 25/50* (2013.01); *H01L 2224/12105* (2013.01); *H01L 2225/107* (2013.01); *H01L 2225/1035* (2013.01); *H01L 2225/1058* (2013.01); *H01L 2924/1431* (2013.01); *H01L 2924/1434* (2013.01); *H01L 2924/15311* (2013.01)

(58) Field of Classification Search
CPC ............. H01L 2224/31; H01L 2924/15; H01L 2225/107; H01L 2225/06503; H01L 2225/06513; H01L 2225/06541; H01L 2225/66572; H01L 2224/32225; H01L 2224/16225; H01L 224/16225; H01L 2224/32146; H01L 2224/32147; H01L 2224/32148; H01L 2224/16151; H01L 2224/16221; H01L 2224/48227; H01L 2924/15311; H01L 2224/73265; H01L 2225/1058; H01L 2225/1041; H01L 2225/1035; H01L 23/5389
See application file for complete search history.

(56) References Cited

U.S. PATENT DOCUMENTS

| | | | |
|---|---|---|---|
| 2009/0174081 A1* | 7/2009 | Furuta | H01L 23/49838 257/777 |
| 2009/0236718 A1* | 9/2009 | Yang | H01L 25/03 257/686 |
| 2012/0056329 A1 | 3/2012 | Pagaila et al. | |
| 2013/0127054 A1 | 5/2013 | Muthukumar et al. | |
| 2014/0048906 A1 | 2/2014 | Shim et al. | |
| 2014/0103516 A1 | 4/2014 | Yeom | |
| 2014/0175671 A1* | 6/2014 | Haba | H01L 23/528 257/777 |
| 2014/0252646 A1* | 9/2014 | Hung | H01L 23/481 257/774 |
| 2015/0050781 A1 | 2/2015 | Guzek et al. | |

FOREIGN PATENT DOCUMENTS

| | | |
|---|---|---|
| CN | 102640283 | 8/2012 |
| TW | 201130105 | 9/2011 |

\* cited by examiner

STRUCTURE AND FORMATION METHOD OF CHIP PACKAGE STRUCTURE

CROSS REFERENCE TO RELATED APPLICATIONS

This application claims the benefit of U.S. Provisional Application No. 62/090,608, filed on Dec. 11, 2014, the entirety of which is incorporated by reference herein.

BACKGROUND

Field of the Disclosure

The disclosure relates to structures and formation methods of chip package structures, and in particular to structures and formation methods of chip package structures including multiple semiconductor dies.

Description of the Related Art

A chip package structure not only provides chips with protection from environmental contaminants, but it also provides a connection interface for the chips packaged therein. As the demand for smaller electronic products grows, manufacturers and others in the electronics industry continually seek ways to reduce the size of integrated circuits used in electronic products. In that regard, three-dimensional type integrated circuit packaging techniques have been developed and put into practice.

Stacked packaging schemes, such as package-on-package (PoP) packaging, have become increasingly popular. As the name implies, PoP is a semiconductor packaging innovation that involves stacking one package on top of another package. A PoP device may combine vertically, for example, discrete memory and logic packages.

New packaging technologies have been developed to improve the density and functions of semiconductor devices. These relatively new types of packaging technologies for semiconductor devices face manufacturing challenges.

BRIEF SUMMARY OF THE DISCLOSURE

In accordance with some embodiments, a chip package structure is provided. The chip package structure includes a first package which includes at least a semiconductor die, a dielectric structure surrounding the semiconductor die, and a plurality of conductive structures penetrating through the dielectric structure and surrounding the semiconductor die. The package structure also includes an interposer substrate over the first package and a plurality of conductive features in or over the interposer substrate. The package structure further includes a second package over the interposer substrate, and the first package electrically couples the second package through the conductive structures and the conductive features.

In accordance with some embodiments, a method for forming a package structure is provided. The method includes providing a first package. The first package includes at least a semiconductor die, a dielectric structure surrounding the semiconductor die, and a plurality of conductive structures penetrating through the dielectric structure and surrounding the semiconductor die. The method also includes bonding an interposer substrate over the first package. The method further includes bonding a second package over the interposer substrate.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings.

DETAILED DESCRIPTION OF THE DISCLOSURE

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It should be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
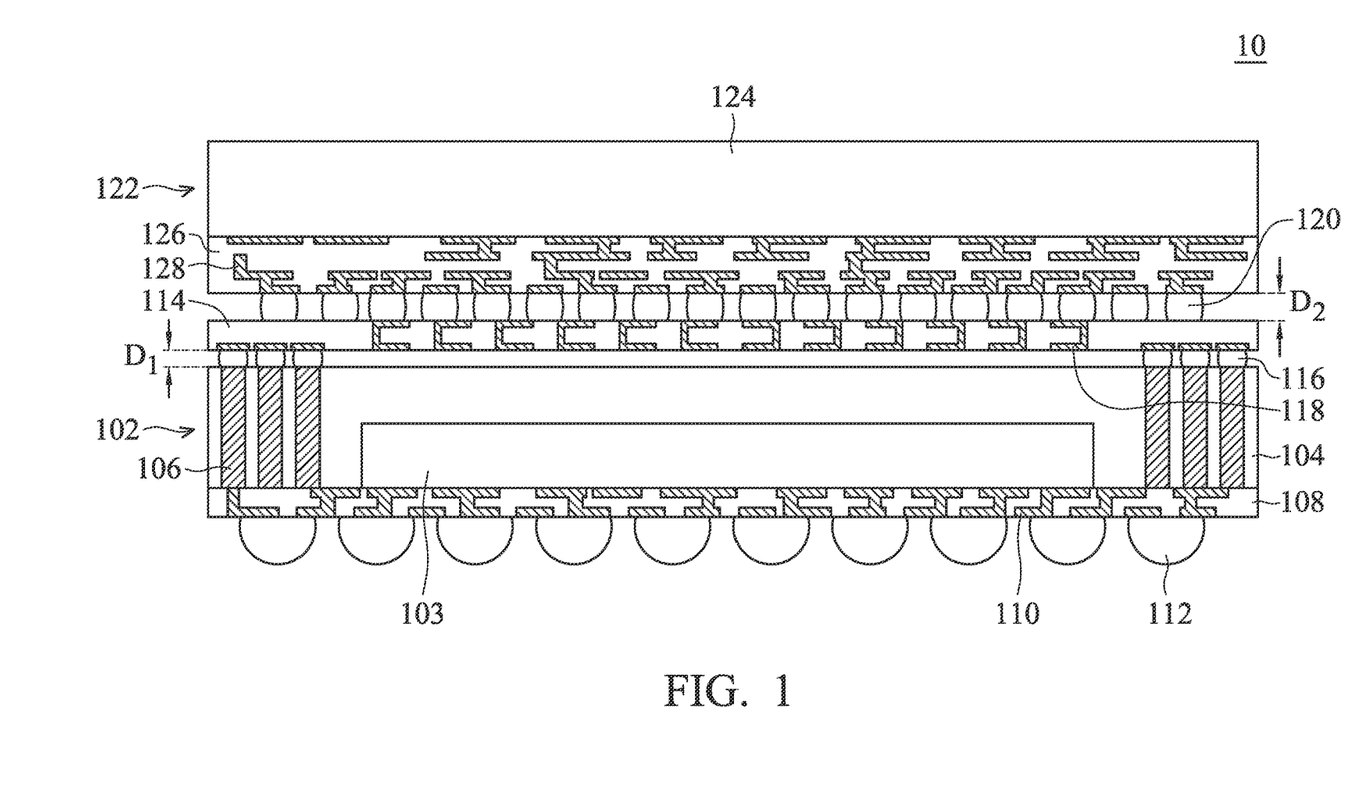
FIG. 1 is a cross-sectional view of a package structure, in accordance with some embodiments.

FIG. 1 is a cross-sectional view of a package structure 10, in accordance with some embodiments. A package 102 is provided. In some embodiments, the package 102 includes at least one semiconductor die, such as a semiconductor die 103. The package 102 also includes a dielectric structure 104 which surrounds the semiconductor die 103. The package 102 further includes one or more conductive structures 106 which penetrate through the dielectric structure 104 and surround the semiconductor die 103. In some embodiments, the dielectric structure 104 is partially removed to form through holes. Afterwards, the through holes are filled with one or more conductive materials to form the conductive structures 106. In some embodiments, the through holes are formed using a laser drilling process, photolithography and etching processes, other applicable processes, or a combination thereof.

In some embodiments, the semiconductor die 103 includes one or more logic devices. In some embodiments, the dielectric structure 104 includes a molding compound material. In some embodiments, the conductive structures 106 are made of copper, aluminum, tungsten, nickel, titanium, gold, platinum, other suitable conductive materials, or a combination thereof.

As shown in FIG. 1, the package 102 includes a dielectric layer 108 and redistribution layers 110 under the dielectric structure 104, the conductive structures 106, and the semiconductor die 103, in accordance with some embodiments. The redistribution layers form electrical connections to the conductive structures 106 and the pads (not shown) of the semiconductor die 103. Therefore, electrical paths to the semiconductor die 103 are fanned out and led to opposite sides of the semiconductor die 103. In some embodiments, multiple deposition and patterning processes are used to form the dielectric layer 108 and the redistribution layers 110.

In some embodiments, the dielectric layer 108 includes multiple stacked layers. In some embodiments, the dielectric layer 108 is made of polyimide, silicon oxide, silicon nitride, epoxy-based materials, other suitable dielectric materials, or a combination thereof. In some embodiments, the redistribution layers 110 include multiple conductive lines and conductive vias. In some embodiments, the redistribution layers 110 are made of copper, aluminum, platinum, tungsten, titanium, platinum, nickel, gold, other suitable conductive materials, or a combination thereof.

As shown in FIG. 1, a number of conductive elements 112 are formed under the redistribution layers 110 and the dielectric layer 108, in accordance with some embodiments. Each of the conductive elements 112 is electrically connected to at least one of the redistribution layers 110. In some embodiments, the conductive elements 112 are made of a solder material. In some other embodiments, the conductive elements 112 include metal posts or metal pillars. For example, the conductive elements 112 include copper posts and/or copper pillars. In some embodiments, the conductive elements 112 are formed using a solder ball placement process, a plating process, other applicable processes, or a combination thereof.

The package 102 may be formed using a variety of methods. In some embodiments, the package 102 is formed using a wafer-level packaging process. In some embodiments, a plurality of semiconductor dies are placed over a carrier substrate such as a glass wafer, a semiconductor wafer, or the like. Afterwards, a wafer molding material is applied over the semiconductor dies and the carrier substrate to fix the semiconductor dies. Then, the dielectric layer 108 and the redistribution layers 110 are formed over the semiconductor dies. The redistribution layers 110 are electrically and correspondingly connected to the semiconductor dies. The conductive elements 112 are then formed over the redistribution layers 110. Afterwards, the carrier substrate is removed, and another carrier is attached to the conductive elements 112. Another wafer molding material may be applied over the semiconductor dies to form the dielectric structure 104. The conductive structures 106 are then formed in the dielectric structure 104. Afterwards, a dicing process is performed to form a plurality of packages 102. Alternatively, the dicing process is not performed at this stage. It should be appreciated, however, that embodiments of the disclosure are not limited thereto. In some other embodiments, the wafer-level packaging process is performed in a different way.

As shown in FIG. 1, an interposer substrate 114 is bonded over the package 102, in accordance with some embodiments. In some embodiments, the interposer substrate 114 is not in direct contact with the package 102. In some embodiments, the interposer substrate 114 is separated from the package 102. For example, the interposer substrate 114 is separated from an upper surface of the package 102 by a distance $D_1$. The distance $D_1$ may be in a range from about 10 μm to about 40 μm. In some other embodiments, the distance $D_1$ is in a range from about 15 μm to about 30 μm. In some embodiments, the interposer substrate 114 is made of a dielectric material. The dielectric material may include epoxy, cyanate ester, polyimide, polytetrafluoroethylene, allylated polyphenylene ether, other suitable dielectric materials, or a combination thereof. In some embodiments, the interposed substrate 114 includes fibers dispersed in the dielectric material. For example, glass fibers are added into the dielectric material.

As shown in FIG. 1, the interposer substrate 114 is bonded over the package 102 by a plurality of conductive elements 116 between the interposer substrate 114 and the package 102, in accordance with some embodiments. In some embodiments, each of the conductive elements 116 is electrically connected to at least one of the conductive structures 106. In some embodiments, the conductive elements 116 are made of one or more solder materials, other suitable conductive materials, or a combination thereof. In some embodiments, the conductive elements 116 are formed using a solder ball placement process, a plating process, other applicable processes, or a combination thereof. In some embodiments, a reflow process is performed to bond the interposer substrate 114 with the package 102 through the conductive elements 116.

As shown in FIG. 1, a plurality of conductive features 118 are formed in and/or over the interposer substrate 114, in accordance with some embodiments. The conductive features 118 provide electrical connections for elements disposed over opposite sides of the interposer substrate 114. In some embodiments, the conductive features 118 are made of cooper, aluminum, tungsten, titanium, gold, platinum, nickel, other suitable conductive materials, or a combination thereof. In some embodiments, the interposer substrate 114 and the conductive features 118 together form a circuit board. In some embodiments, the interposer substrate 114 and the conductive features 118 are formed using a process suitable for forming a printed circuit board. However, it should be appreciated that embodiments of the disclosure are not limited thereto. In some other embodiments, different materials and/or processes are used to form the interposer substrate 114 and the conductive features 118.

As shown in FIG. 1, a package 122 is provided and bonded over the interposer substrate 114, in accordance with some embodiments. In some embodiments, the package 122 includes a semiconductor die 124. In some embodiments, the semiconductor die 124 includes one or more memory devices. In some embodiments, the semiconductor die 124 includes one or more logic devices. A dielectric layer 126 and multiple redistribution layers 128 are formed over the semiconductor die 124, as shown in FIG. 1 in accordance with some embodiments. In some embodiments, the dielectric layer 126 includes multiple stacked layers. In some embodiments, the dielectric layer 126 is made of polyimide, silicon oxide, silicon nitride, epoxy-based materials, other suitable dielectric materials, or a combination thereof. In some embodiments, the redistribution layers 128 include multiple conductive lines and conductive vias. In some embodiments, the redistribution layers 128 are made of copper, aluminum, platinum, tungsten, titanium, platinum, nickel, gold, other suitable conductive materials, or a combination thereof.

Embodiments of the disclosure have many variations. For example, the package 122 is not limited to being bonded over the interposer substrate 114 after the interposed substrate 114 is bonded over the package 102. In some other embodiments, the package 122 is bonded over the interposed substrate 114. Afterwards, the interposed substrate 114 is bonded over the package 102.

In some embodiments, the interposer substrate 114 is not in direct contact with the package 122. In some embodiments, the interposer substrate 114 is separated from the package 122. For example, the interposer substrate 114 is separated from a lower surface of the package 122 by a distance $D_2$. The distance $D_2$ may be in a range from about 10 μm to about 50 μm. In some other embodiments, the distance $D_2$ is in a range from about 15 μm to about 40 μm. In some embodiments, the distance $D_2$ is longer than the distance $D_1$.

As shown in FIG. 1, the package 122 is bonded over the interposer substrate 114 by a plurality of conductive elements 120 between the interposer substrate 114 and the package 122, in accordance with some embodiments. In some embodiments, each of the conductive elements 120 is electrically connected to at least one of the conductive features 118. In some embodiments, each of the conductive elements 120 is electrically connected to at least one of the conductive structures 106 penetrating through the dielectric structure 104. For example, the conductive elements 120 are electrically connected to the conductive structures 106 through the conductive features 118. In some embodiments, the conductive elements 120 are made of one or more solder materials, other suitable conductive materials, or a combination thereof. In some embodiments, the conductive elements 120 are formed using a solder ball placement process, a plating process, other applicable processes, or a combination thereof. In some embodiments, a reflow process is performed to bond the package 122 with the interposer substrate 114 through the conductive elements 120.

Embodiments of the disclosure use the interposer substrate 114 to build electrical connections between the packages 102 and 122 over opposite sides of the interposer substrate 114. In some cases, the bonding between the interposer substrate 114 and the package 102 and/or the package 122 might not be good enough and a rework process may need to be performed. Because the interposer substrate 114 is not in direct contact with both of the packages 102 and 122, the rework process could be performed more easily. Damages to the packages 102 and 122 may be prevented or significantly reduced during the rework process. In some embodiments, the interposer substrate 114 provides stronger mechanical support. As a result, the processes, such as the bonding processes, may be performed in a more reliable way.

Figure 2:
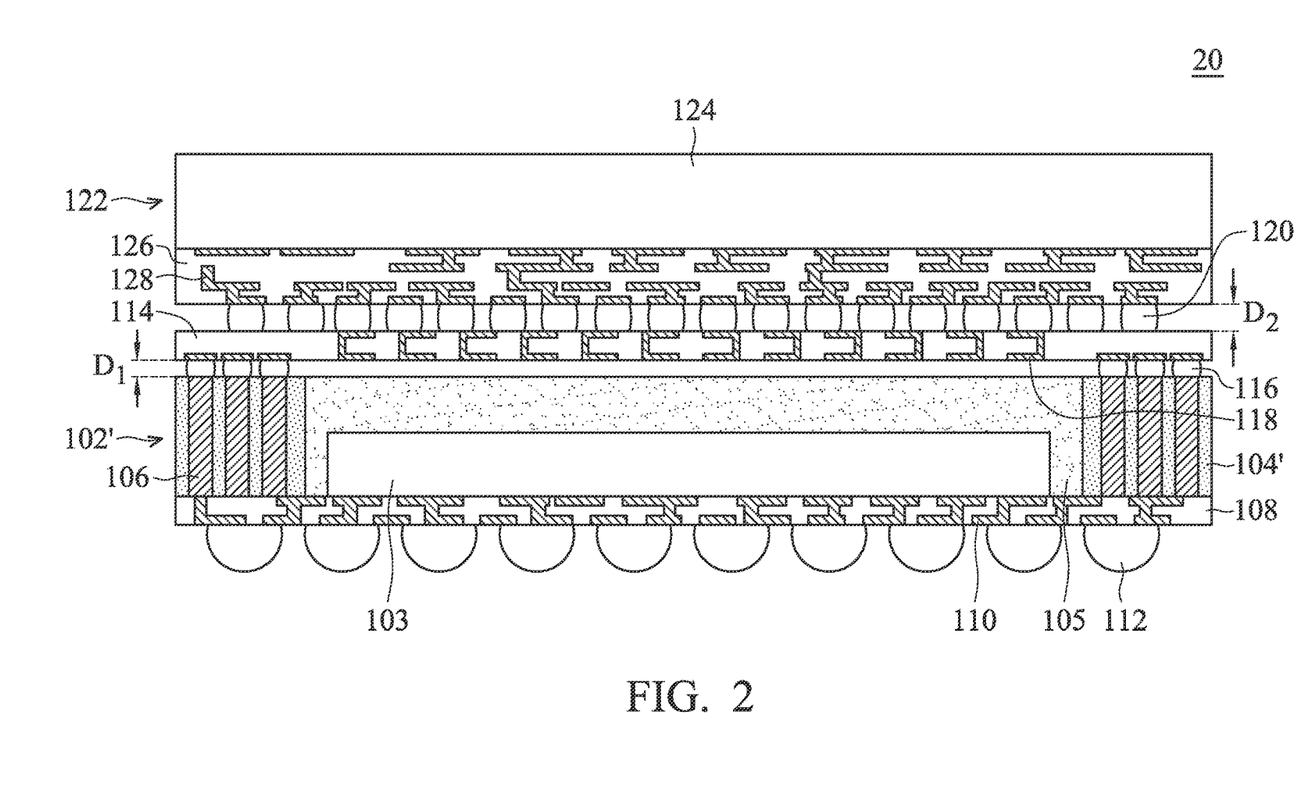
FIG. 2 is a cross-sectional view of a package structure, in accordance with some embodiments.

Embodiments of the disclosure have many variations. FIG. 2 is a cross-sectional view of a package structure 20, in accordance with some embodiments. The package structure 20 is similar to the package structure 10 shown in FIG. 1. A package 102' similar to the package 102 is provided. In some embodiments, the package 102' includes a dielectric structure 105 and a dielectric structure 104'. As shown in FIG. 2, the dielectric structure 105 surrounds the semiconductor die 103, and the dielectric structure 104' surrounds the dielectric structure 105 and the semiconductor die 103. In some embodiments, materials of the dielectric structures 104' and 105 are different from each other. In some embodiments, the dielectric structure 105 is made of a molding compound material. In some embodiments, the dielectric structure 104' is made of a material similar to that of a printed circuit board. In some embodiments, a printed circuit board is partially removed to form a recess where the semiconductor die 103 is then positioned. Afterwards, a molding compound material is applied into the recess to form the dielectric structure 105 which surrounds and covers the semiconductor die 103.

As shown in FIG. 2, the conductive structures 106 are formed in the dielectric structure 104', in accordance with some embodiments. Similarly, the conductive structures 106 in the dielectric structure 104' are used as conductive bridges between the packages 102' and 122.

Figure 3:
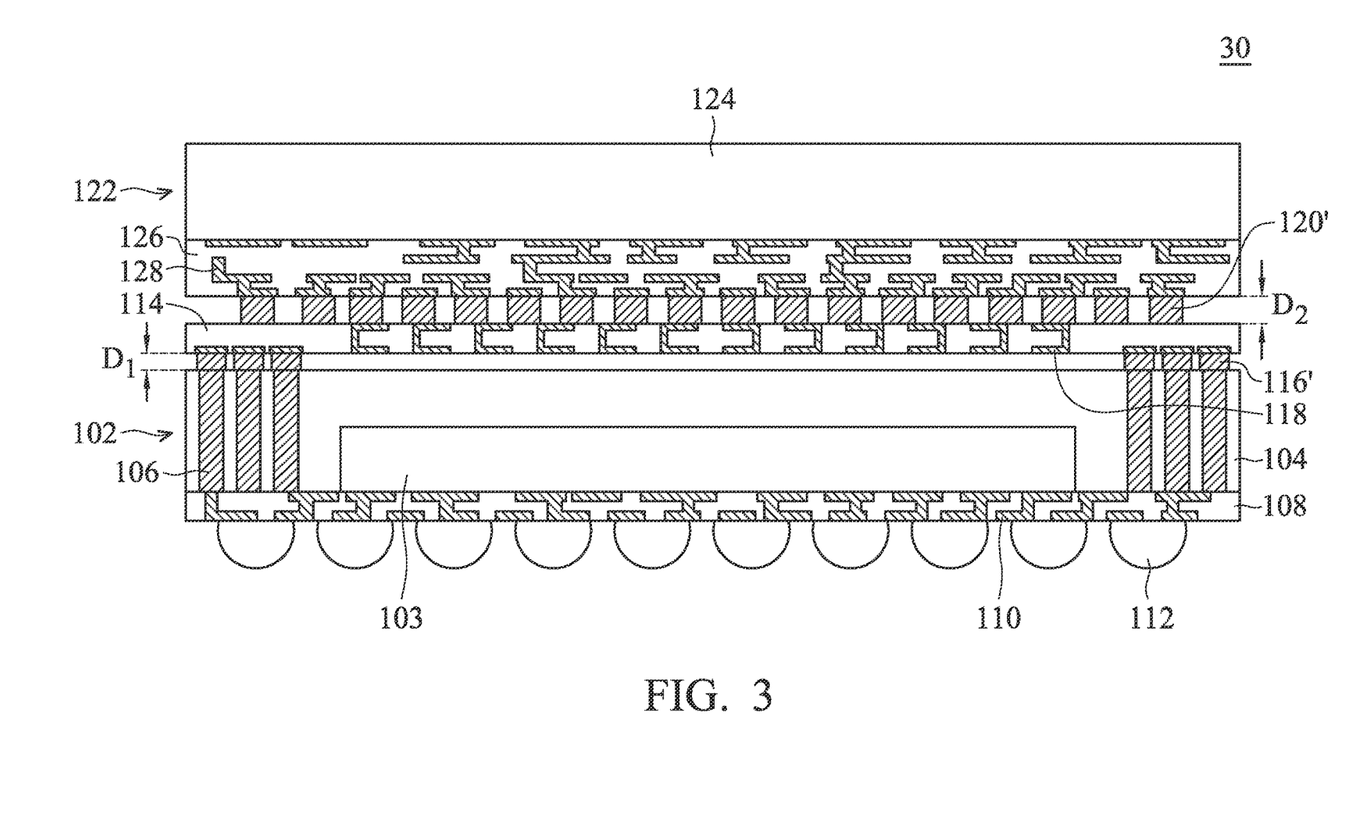
FIG. 3 is a cross-sectional view of a package structure, in accordance with some embodiments.

Embodiments of the disclosure have many variations. FIG. 3 is a cross-sectional view of a package structure 30, in accordance with some embodiments. The package structure 30 is similar to the package structure 10 shown in FIG. 1. As shown in FIG. 3, conductive elements 116' and 120' are used to bond the interposer substrate 114 with the packages 102 and 122, respectively. In some embodiments, the conductive elements 116' include metal pillars. For example, the metal pillars are copper pillars. In some other embodiments, the conductive elements 116' are made of a metal material different from copper. In some embodiments, the metal pillars are bonded to the conductive structures 106 through a bonding material. For example, the bonding material includes a solder material. Similarly, the metal pillars are bonded to the conductive features 118 through a bonding material, such as a solder material.

In some embodiments, the conductive elements 120' include metal pillars. For example, the metal pillars are copper pillars. In some other embodiments, the conductive elements 120' are made of a metal material different from copper. In some embodiments, the metal pillars are bonded to the redistribution layers 128 through a bonding material. For example, the bonding material includes a solder material. In some embodiments, each of the conductive elements 120' is larger than each of the conductive elements 116'.

Figure 4:
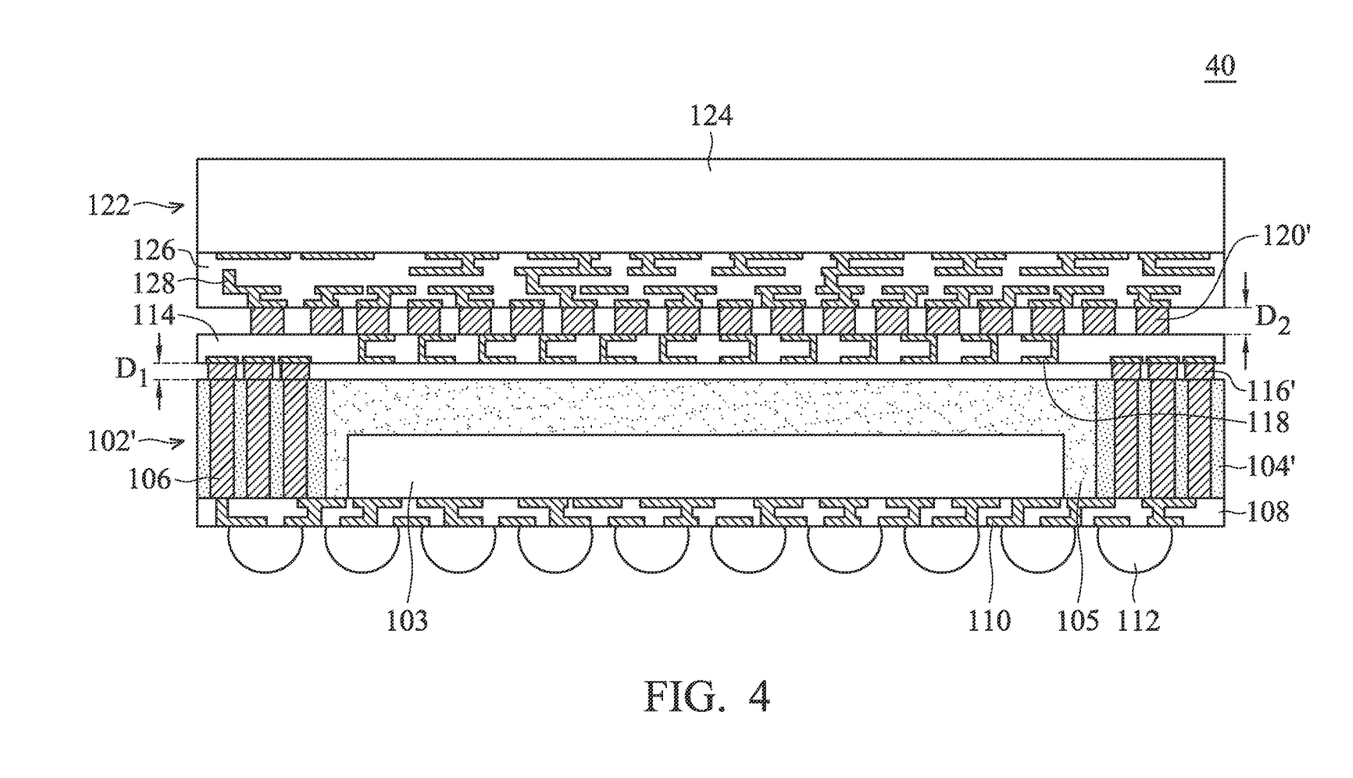
FIG. 4 is a cross-sectional view of a package structure, in accordance with some embodiments.

FIG. 4 is a cross-sectional view of a package structure 40, in accordance with some embodiments. The package structure 40 is similar to the package structure 20 shown in FIG. 2. Similar to the embodiments shown in FIG. 3, the conductive elements 116' and 120' are used to bond the interposer substrate 114 with the packages 102 and 122, as shown in FIG. 4 in accordance with some embodiments.

Figure 5:
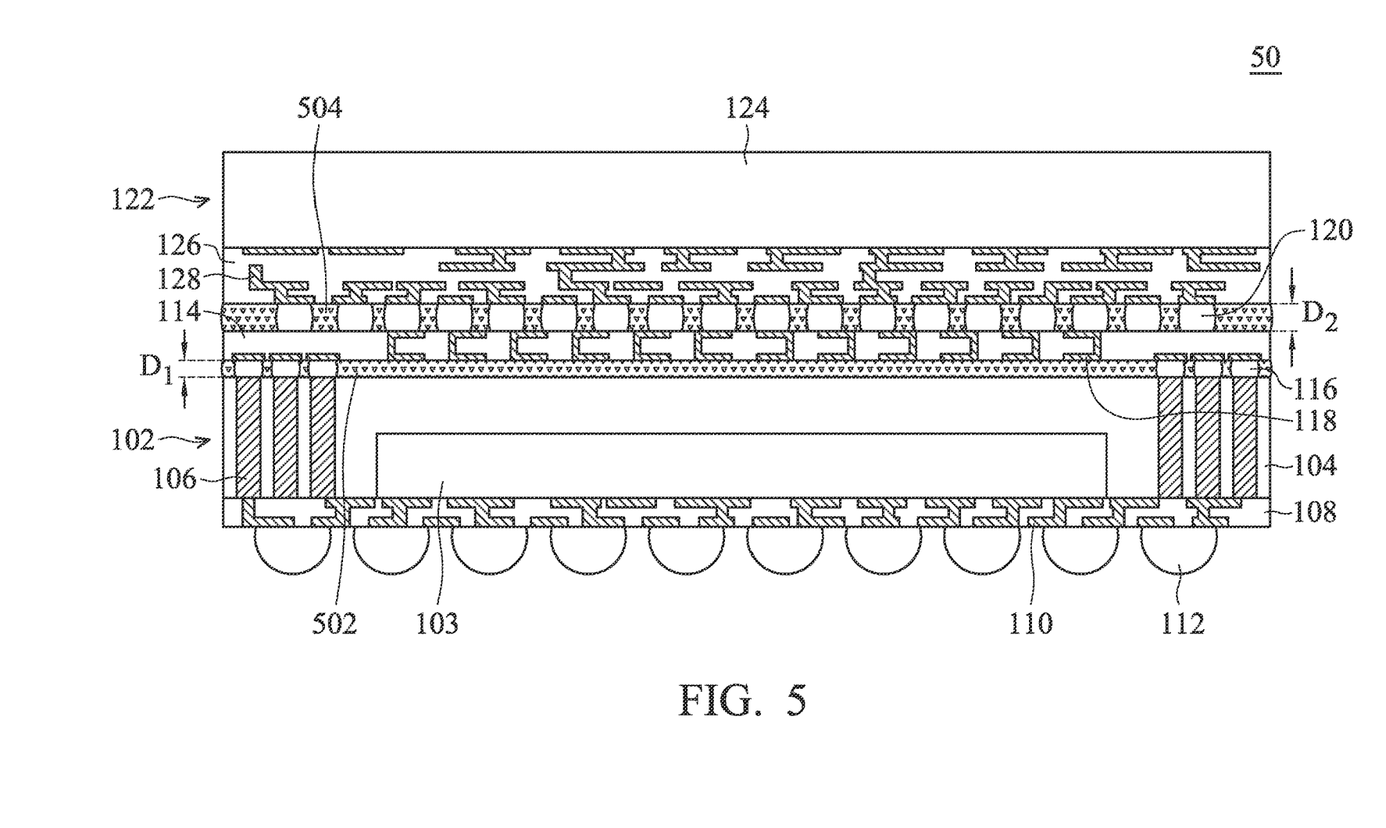
FIG. 5 is a cross-sectional view of a package structure, in accordance with some embodiments.

Embodiments of the disclosure have many variations. FIG. 5 is a cross-sectional view of a package structure 50, in accordance with some embodiments. The package structure 50 is similar to the package structure 10 shown in FIG. 1. As shown in FIG. 5, an underfill material 502 is formed between the interposer substrate 114 and the package 102, in accordance with some embodiments. As shown in FIG. 5, an underfill material 504 is formed between the interposer substrate 114 and the package 122, in accordance with some embodiments. The under fill materials 502 and 504 protect the conductive elements 116 and 120, respectively. In some embodiments, the under fill materials 502 and 504 are used to protect the conductive elements 116' and 120' shown in FIG. 3.

Figure 6:
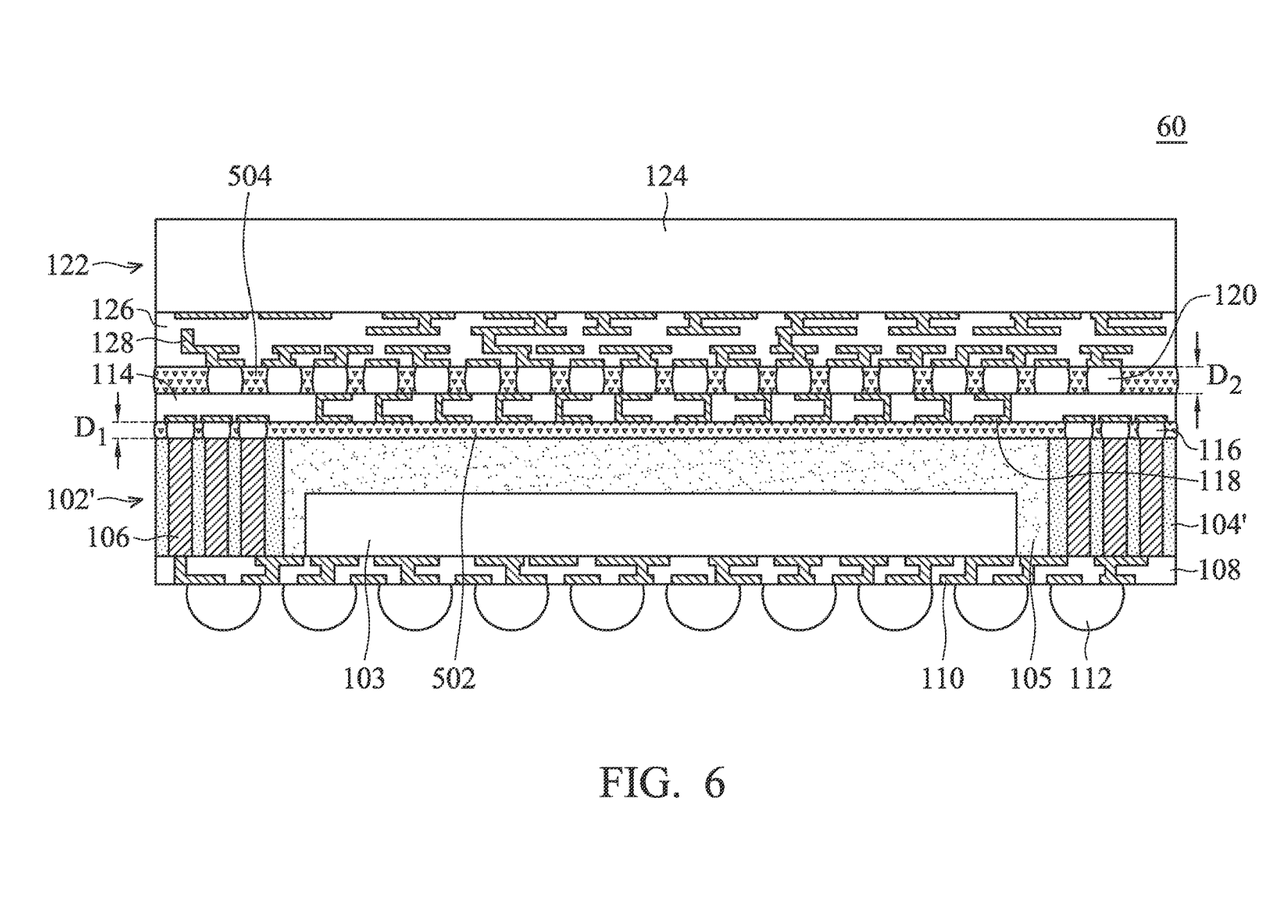
FIG. 6 is a cross-sectional view of a package structure, in accordance with some embodiments.

Embodiments of the disclosure have many variations. FIG. 6 is a cross-sectional view of a package structure 60, in accordance with some embodiments. The package structure 60 is similar to the package structure 20 shown in FIG. 2. As shown in FIG. 6, an underfill material 502 is formed between the interposer substrate 114 and the package 102', in accordance with some embodiments. As shown in FIG. 5, an underfill material 504 is formed between the interposer substrate 114 and the package 122, in accordance with some embodiments. The under fill materials 502 and 504 protect the conductive elements 116 and 120. In some embodiments, the under fill materials 502 and 504 are used to protect the conductive elements 116' and 120' shown in FIG. 4.

Embodiments of the disclosure use an interposer substrate to bond two or more packages together. The interposer substrate builds electrical connections between the packages over opposite sides of the interposer substrate. The interposer substrate provides larger process windows and stronger support to the packages. For example, a rework process, if needed, can be performed more easily. As a result, the associated processing cost and processing time are reduced significantly.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A chip package structure, comprising:
   a first package, wherein the first package comprises:
   at least a semiconductor die;
   a dielectric structure surrounding the semiconductor die;
   a plurality of conductive structures penetrating through the dielectric structure and surrounding the semiconductor die;
   a second dielectric structure surrounding the semiconductor die, wherein the dielectric structure surrounds the second dielectric structure;
   an interposer substrate over the first package, the interposer substrate having a bottom surface facing the first package, an opposing top surface facing away from the first package, and a plurality of conductive features providing electrical connections between the top surface and the bottom surface of the interposer substrate; and
   a second package over the top surface of the interposer substrate, wherein the first package electrically couples the second package through the conductive structures and the conductive features, and the interposer substrate is between the second package and a top-most surface of the dielectric structure of the first package;
   wherein the conductive structures completely penetrate through the dielectric structure, with ends of the conductive structures terminating at corresponding exterior surfaces of the dielectric structure,
   wherein materials of the dielectric structure and the second dielectric structure are different from each other and wherein the interposer substrate is spaced from the first package by only a plurality of conductive elements between the interposer substrate and the first package.

2. The chip package structure as claimed in claim 1, wherein the interposer substrate is separated from the first package.

3. The chip package structure as claimed in claim 2, further comprising a plurality of conductive elements between the interposer substrate and the first package, wherein each of the conductive elements is electrically connected to at least one of the conductive structures.

4. The chip package structure as claimed in claim 3, wherein the conductive elements comprise a solder material.

5. The chip package structure as claimed in claim 3, wherein the conductive elements comprise copper pillars.

6. The chip package structure as claimed in claim 3, further comprising an underfill material between the interposer substrate and the first package, and surrounding the conductive elements.

7. The chip package structure as claimed in claim 3, wherein the interposer substrate is separated from the second package.

8. The chip package structure as claimed in claim 7, further comprising a plurality of second conductive elements between the interposer substrate and the second package, wherein each of the second conductive elements is electrically connected to at least one of the conductive structures.

9. The chip package structure as claimed in claim 8, wherein the second conductive elements comprise a solder material.

10. The chip package structure as claimed in claim 8, further comprising a second underfill material between the interposer substrate and the second package and surrounding the second conductive elements.

11. The chip package structure as claimed in claim 1, wherein the second package comprises at least one memory device.

12. The chip package structure as claimed in claim 1, wherein the first package comprises at least one logic device.

13. The chip package structure as claimed in claim 1, wherein the dielectric structure comprises a molding compound material.

14. The chip package structure as claimed in claim 1, wherein the second dielectric structure comprises a molding compound material.

15. The chip package structure as claimed in claim 1, further comprising a redistribution layer under the dielectric structure, the conductive structures, and the semiconductor die.

16. A method for forming a package structure; comprising:
   providing a first package, wherein the first package comprises:
   at least a semiconductor die;
   a dielectric structure surrounding the semiconductor die;
   a plurality of conductive structures penetrating through the dielectric structure and surrounding the semiconductor die; and
   a second dielectric structure surrounding the semiconductor die, wherein the dielectric structure surrounds the second dielectric structure;
   bonding an interposer substrate over the first package, the interposer substrate having a bottom surface facing the first package, an opposing top surface facing away from the first package, and a plurality of conductive features providing electrical connections between the top surface and the bottom surface of the interposer substrate; and bonding a second package over the top surface of the interposer substrate such that the interposer substrate is between the second package and a top-most surface of the dielectric structure of the first package;

wherein the conductive structures completely penetrate through the dielectric structure, with ends of the conductive structures terminating at corresponding exterior surfaces of the dielectric structure, wherein materials of the dielectric structure and the second dielectric structure are different from each other and wherein the interposer substrate is spaced from the first package by only a plurality of conductive elements between the interposer substrate and the first package.

17. The method for forming a package structure as claimed in claim 16, wherein the interposer substrate is bonded over the first package by a plurality of first conductive elements, and the second package is bonded over the interposer substrate by a plurality of second conductive elements.

* * * * *